United States Patent
Jeong et al.

(10) Patent No.: US 10,290,517 B2
(45) Date of Patent: May 14, 2019

(54) ETCHING APPARATUS AND METHOD, AND FLEXIBLE FILM ETCHED BY THE ETCHING METHOD

(71) Applicant: HANWHA AEROSPACE CO., LTD., Changwon, Gyeongsangnam-do (KR)

(72) Inventors: Jaeyun Jeong, Gyeonggi-do (KR); Kisoo Kim, Gyeonggi-do (KR); Seungmin Cho, Gyeonggi-do (KR)

(73) Assignee: HANWHA AEROSPACE CO., LTD., Changwon-si, Gyeongsagnam-do (KR)

( * ) Notice: Subject to any disclaimer, the term of this patent is extended or adjusted under 35 U.S.C. 154(b) by 28 days.

(21) Appl. No.: 15/045,701

(22) Filed: Feb. 17, 2016

(65) Prior Publication Data
US 2017/0236726 A1  Aug. 17, 2017

(30) Foreign Application Priority Data
Feb. 15, 2016  (KR) .................. 10-2016-0017389

(51) Int. Cl.
*H01L 21/67* (2006.01)
*H01L 21/687* (2006.01)
(Continued)

(52) U.S. Cl.
CPC .. *H01L 21/67023* (2013.01); *H01L 21/02057* (2013.01); *H01L 21/30604* (2013.01);
(Continued)

(58) Field of Classification Search
None
See application file for complete search history.

(56) References Cited

U.S. PATENT DOCUMENTS 3,748,677 A * 7/1973 Frank ................ H01L 21/67028
15/88.3
4,521,214 A * 6/1985 Weis ...................... B05C 3/125
118/405
(Continued)

FOREIGN PATENT DOCUMENTS

JP    2002-004069 A    1/2002
JP    2004-249181 A    9/2004
(Continued)

OTHER PUBLICATIONS

Machine Generated English Translation of JP2004-249181A. Published Sep. 9, 2004.*
(Continued)

*Primary Examiner* — Sylvia MacArthur
(74) *Attorney, Agent, or Firm* — Ladas & Parry LLP

(57) ABSTRACT

Disclosed herein are an etching apparatus and method that are capable of performing an etching process in the state where a flexible film is wound around a drum-type jig, and a flexible film etched by the etching method. The etching apparatus includes a process tank containing an etchant therein, a drum-type jig rotatably provided in the process tank to be immersed into the etchant in a state where a flexible film on which a thin film is formed is wound around the drum-type jig, and a drum-type jig driver configured to rotate the drum-type jig. The etching apparatus has a compact structure to efficiently perform the etching process on the large area flexible film on which the thin film is formed.

19 Claims, 14 Drawing Sheets

(51) Int. Cl.
*H01L 21/02* (2006.01)
*H01L 29/16* (2006.01)
*H01L 21/306* (2006.01)
*C23F 1/40* (2006.01)
*B24B 37/04* (2012.01)
*C23F 1/08* (2006.01)
*B24B 37/10* (2012.01)

(52) U.S. Cl.
CPC .... *H01L 21/6708* (2013.01); *H01L 21/68764* (2013.01); *H01L 29/1606* (2013.01); *B24B 37/042* (2013.01); *B24B 37/10* (2013.01); *C23F 1/08* (2013.01); *C23F 1/40* (2013.01)

(56) References Cited

U.S. PATENT DOCUMENTS

| | | | | |
|---|---|---|---|---|
| 6,814,089 | B1* | 11/2004 | Voges | B08B 1/02 134/111 |
| 7,029,597 | B2* | 4/2006 | Marczak | C23G 1/22 205/214 |
| 2010/0101920 | A1* | 4/2010 | Kim | H01L 21/67706 198/788 |
| 2015/0014088 | A1* | 1/2015 | Seo | H04R 1/023 181/175 |
| 2015/0336136 | A1* | 11/2015 | Rogers | B03B 5/02 501/27 |

FOREIGN PATENT DOCUMENTS

| | | | |
|---|---|---|---|
| JP | 2004249181 A | * | 9/2004 |
| JP | 2006-030432 A | | 2/2006 |
| JP | 2010-179987 A | | 8/2010 |

OTHER PUBLICATIONS

Machine Generated English Translation of JP2010-179987. Published Aug. 19, 2010.*

* cited by examiner

ETCHING APPARATUS AND METHOD, AND FLEXIBLE FILM ETCHED BY THE ETCHING METHOD

CROSS REFERENCE TO RELATED APPLICATION

The present application claims priority to Korean Patent Application No. 10-2016-0017389, filed Feb. 15, 2016, the entire contents of which is incorporated herein for all purposes by this reference.

TECHNICAL FIELD

The present invention relates to an etching apparatus. More particularly, the present invention relates to an etching apparatus and method that are capable of uniformly etching a surface of a flexible film by a dipping method, and a flexible film etched by the etching method.

RELATED ART

Generally, in order to mass-produce semiconductor elements, such as a photovoltaic-cell element, a system semiconductor, or an optical-film element for a display, technology for continuously forming a large area micro-pattern on a film substrate is required.

In the fabrication of such a semiconductor element, an etching process is needed, in which a thin film having a micro-circuit pattern is layered on a film substrate and unnecessary parts are removed from the thin film to expose the micro-circuit pattern.

The etching process is typically classified into a wet method and a dry method. The wet etching method is a method of cutting unnecessary parts from the thin film, layered on the film substrate, by liquid chemicals. In contrast, the dry etching method is intended to remove unnecessary parts from the thin film not by liquid but by gas.

Recently, as a line width of a circuit becomes very fine and a size of a substrate is increased, the dry etching method is increasingly used to enhance a yield. However, the dry etching method is problematic in that it is more expensive and more complicated than the wet etching method. Examples of the wet etching method include a dipping method, a spray method, etc.

As an example, FIG. 1 schematically illustrates a conventional etching apparatus using a spray method disclosed in Korean Patent No. 1021931 (Mar. 16, 2011).

As illustrated in FIG. 1, the conventional etching apparatus includes a first nozzle part 10 causing an etchant to flow along a surface of a substrate 1, a second nozzle part 20 spraying the etchant from a side of the substrate 1, and a fixing part 30 fixing the substrate 1 to a predetermined position. In the state where the substrate 1 is fixed by the fixing part 30 to be erected upwards, a surface of the substrate is etched by the etchant flowing out from the first nozzle part 10, and simultaneously is etched by the etchant sprayed from the second nozzle part 20.

However, the conventional etching apparatus is problematic in that it is difficult to spray the etchant onto the flexible film in the state where the film is erected upwards, so that it is difficult to apply the apparatus to the etching process for the flexible film.

Meanwhile, in order to etch a large area film substrate by the etching method using the dipping method, the film substrate is attached to a rigid plate and then is vertically or horizontally placed in an etching tank containing the etchant. In such a state, the etching process is carried out.

However, the conventional dipping method requires a large-sized etching tank for etching a large area flexible film, a large-sized transfer apparatus for transferring the flexible film together with a plate, and a large-sized washing apparatus and drying apparatus. Therefore, this method is problematic in that a large space and high cost are needed. Further, the conventional etching method is problematic in that it is not easy to treat the surface of the flexible film in a non-contact manner, and in addition, it is not easy in terms of equipment to ensure an ability to uniformly etch the surface. Moreover, a large number of components is required to ensure such an ability, so that the cost of the apparatus is drastically increased.

SUMMARY

Accordingly, the present invention has been made keeping in mind the above problems occurring in the related art, and the present invention is intended to propose an etching apparatus and method, in which an etching process is performed with a flexible film being wound around a drum-type jig, thus simplifying a structure of the apparatus, reducing operation space, and improving etching uniformity, and a flexible film etched by the etching method.

In order to accomplish the object, there is provided an etching apparatus, including a process tank containing an etchant therein; a drum-type jig rotatably provided in the process tank to be immersed into the etchant in a state where a flexible film on which a thin film is formed is wound around the drum-type jig; and a drum-type jig driver configured to rotate the drum-type jig.

The etching apparatus may further include an injection nozzle provided in the process tank to spray the etchant towards the flexible film wound around the drum-type jig; and a process pump configured to pump the etchant to the injection nozzle.

The etching apparatus may further include a washing-liquid supply unit supplying washing liquid to the process tank to which the etchant is discharged, to perform a washing process on the flexible film wound around the drum-type jig, wherein the process pump may be provided in the process tank to pump the etchant or the washing liquid contained in the process tank to the injection nozzle.

The drum-type jig may include a plurality of flow guide grooves along an outer circumference thereof to generate a flow of the etchant towards the flexible film wound therearound when the jig may be rotated.

The etching apparatus may further include a rotary body rotatably provided in the process tank; a plurality of blades provided on the rotary body; and a flow generator having a rotary-body driver to rotate the rotary body and generating the flow of the etchant towards the flexible film wound around the drum-type jig.

The etching apparatus may further include an etchant tank provided adjacent to the process tank to store the etchant therein, wherein the etchant in which foreign matter generated during the etching process may float may overflow from the process tank to the etchant tank.

The etching apparatus may further include a circulation pipe connecting the process tank with the etchant tank to allow the etchant to flow therein; and an etchant pump pumping the etchant stored in the etchant tank through the circulation pipe to the process tank.

The etching apparatus may further include a carrier film coupled with the flexible film; and a coiler drum coupled with the carrier film and rotated forwards or backwards to wind or unwind the carrier film.

The etching apparatus may further include a drying unit provided on a transfer path of the flexile film transferred by the carrier film to spray air onto the flexible film transferred by the carrier film and then dry the carrier film.

The etching apparatus may further include a washing unit provided on a transfer path of the flexile film transferred by the carrier film to spray washing liquid onto the flexible film transferred by the carrier film and then wash the carrier film.

Further, the present invention is intended to propose an etching method, including (a) winding a flexible film on which a thin film is formed around a drum-type jig, and then dipping the flexible film wound around the drum-type jig in an etchant; (b) generating a flow of the etchant around the flexible film that is wound around the drum-type jig and dipped in the etchant to etch the flexible film; (c) washing the flexible film with washing liquid, after the etching process of (b); and (d) drying the flexible film, after the washing process of (c).

(b) may include continuously supplying an etchant to a process tank in which the drum-type jig and the etchant are contained; and overflowing the etchant in which foreign matter generated during the etching process floats, from the process tank.

At (b), the drum-type jig may be rotated and the etchant may be sprayed towards the flexible film wound around the drum-type jig to generate the flow of the etchant around the flexible film.

At (c), the washing liquid may be supplied to wash the flexible film with the flexible film being wound around the drum-type jig.

At (c), the washing liquid may be supplied to wash the flexible film while the flexible film may be unwound from the drum-type jig and transferred.

At (d), air may be sprayed to dry the flexible film.

Furthermore, the present invention is intended to propose a flexible film etched by the above-described method.

As is apparent from the above description, an etching apparatus according to the present invention is capable of effectively performing an etching process on a large area flexible film on which a thin film (e.g., graphene thin-film) is formed in a compact structure.

Further, the present invention is capable of etching a surface of a flexible film with a uniform quality by generating a uniform flow of an etchant on a surface of the flexible film.

Furthermore, the present invention prevents a flexible film from being crumpled by maintaining tension when the flexible film is being moved, and prevents the flexible film from coming into contact with an external component, thus preventing a thin film formed on the flexible film from being damaged.

Further, the present invention is simple in structure and has easy workability, thus allowing an etching operation to be performed by a few workers.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Hereinafter, an etching apparatus and method according to the present invention, and a flexible film etched by the etching method will be described in detail with reference to the accompanying drawings.

Figure 1:
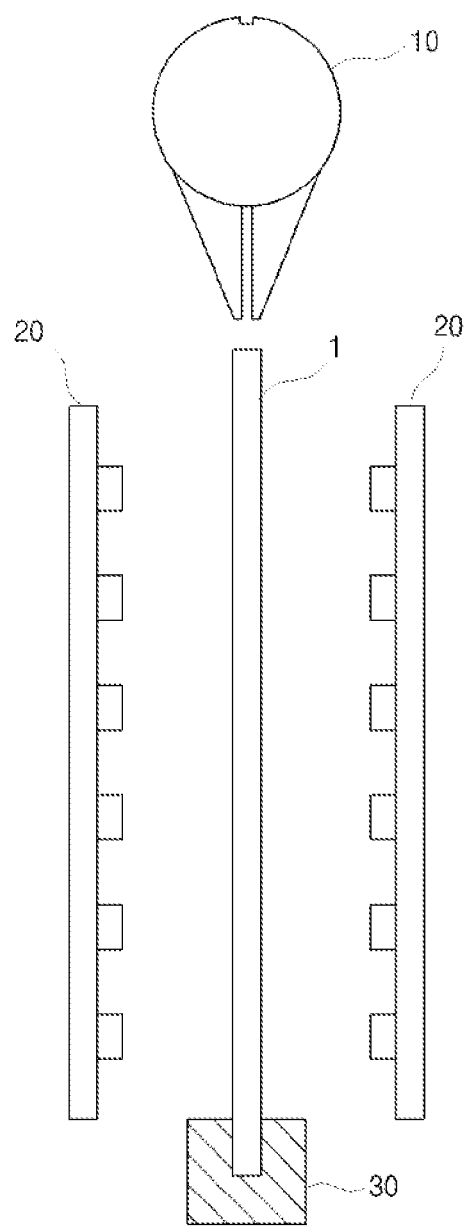
FIG. 1 schematically illustrates a conventional etching apparatus.
Figure 2:
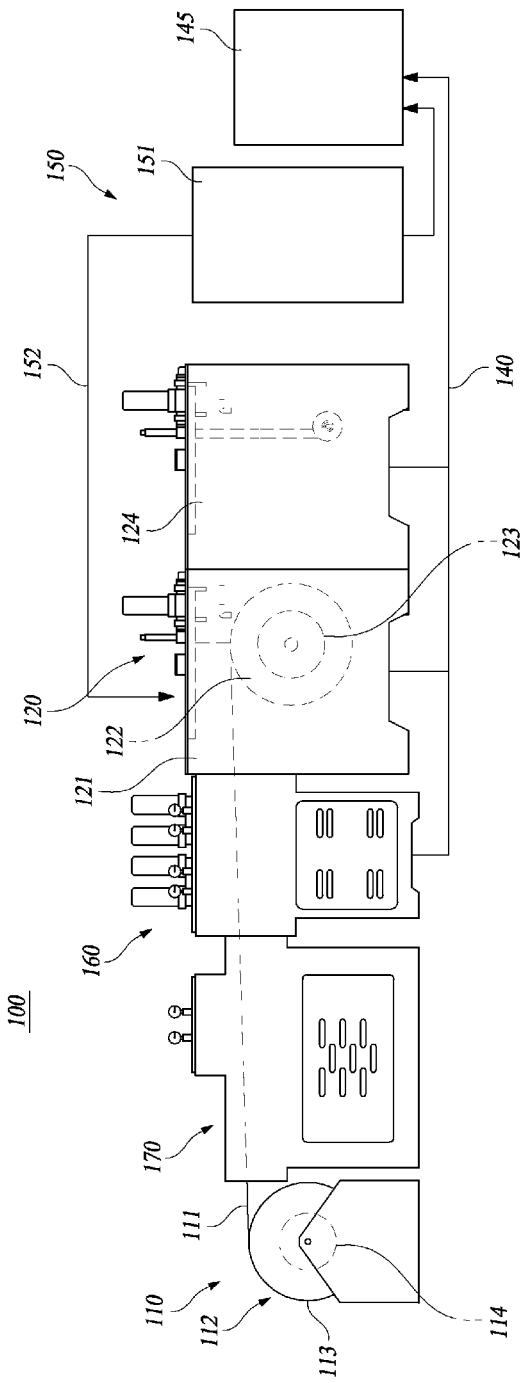
FIG. 2 is a side view illustrating an etching apparatus according to an embodiment of the present invention.
Figure 3:
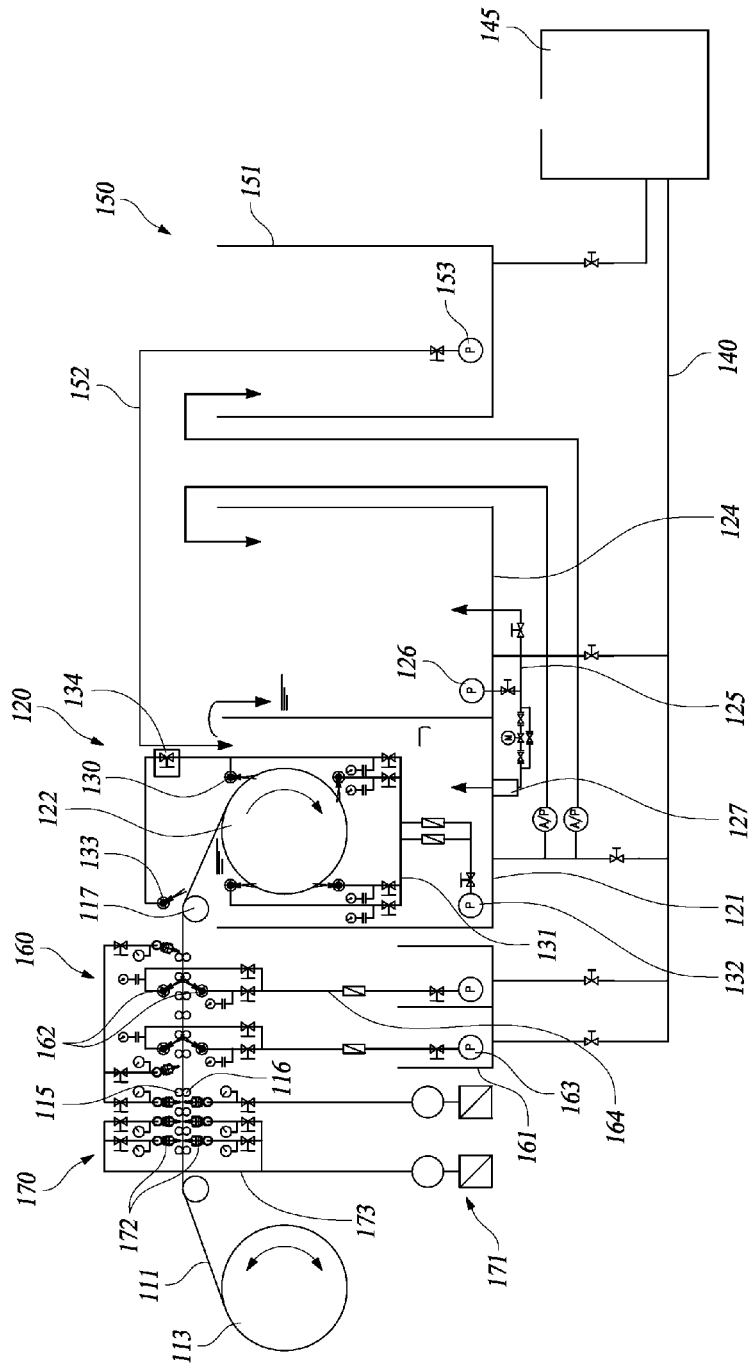
FIG. 3 is a view illustrating the schematic configuration of the etching apparatus according to the embodiment of the present invention.
Figure 4:
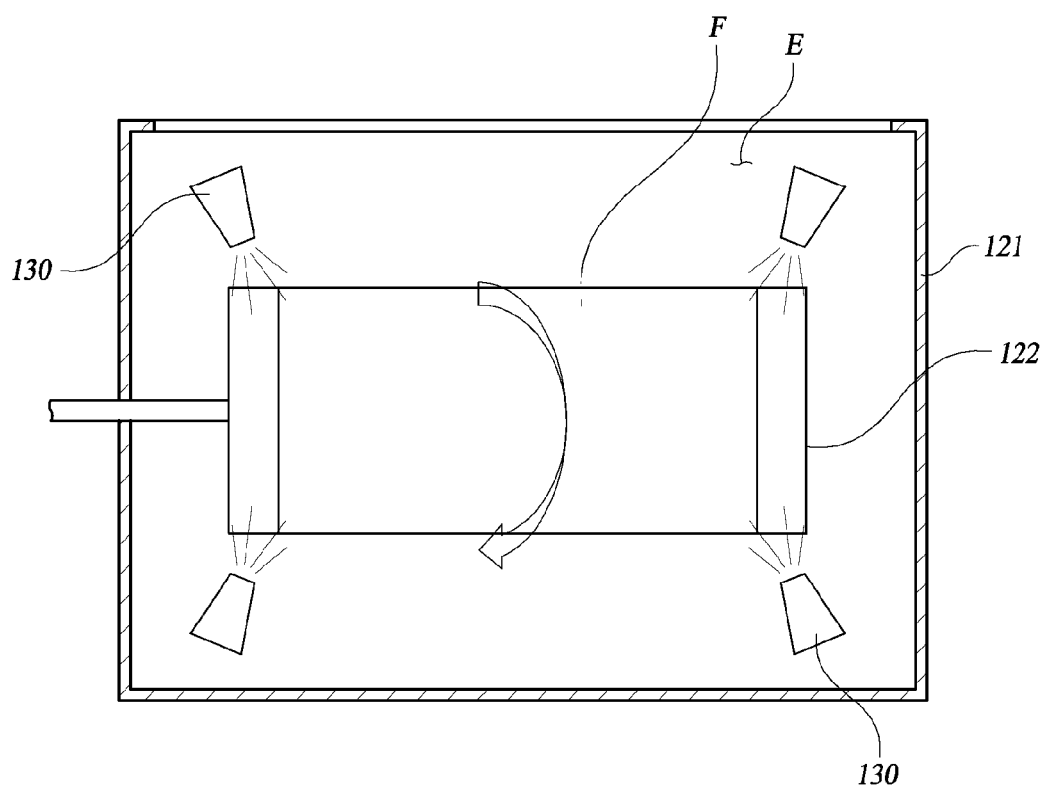
FIG. 4 is a front sectional view illustrating the configuration of a part of an etching unit provided in the etching apparatus according to the embodiment of the present invention.

FIG. 2 is a side view illustrating an etching apparatus according to an embodiment of the present invention, FIG. 3 is a view illustrating the schematic configuration of the etching apparatus according to the embodiment of the present invention, FIG. 4 is a front sectional view illustrating the configuration of a part of an etching unit provided in the etching apparatus according to the embodiment of the present invention, and FIGS. 5 to 11 illustrate an etching method performed by the etching apparatus according to the embodiment of the present invention.

As illustrated in FIGS. 2 and 3, an etching apparatus 100 according to an embodiment of the present invention includes a transfer unit 110, an etching unit 120, a washing-liquid supply unit 150, a washing unit 160, and a drying unit 170. Such an etching apparatus 100 may uniformly etch a surface of a flexible film F on which various thin films are formed.

By way of example, the etching apparatus 100 according to this embodiment may be used in an etching process for removing catalytic metal during the process of manufacturing the graphene thin-film.

As is well known to those skilled in the art, graphene is a new two-dimensional carbon substance that was discovered in 2004, and is a very thin-film structure that is composed of a single carbon atomic layer forming a hexagonal honeycombed structure. Graphene is the most excellent among existing substances in terms of several features, such as strength, heat conductivity, and electron mobility. Accordingly, graphene appeals to people as an important material that is applicable to various technologies, including displays, secondary batteries, photovoltaic cells, light emitting elements and sensors, etc.

Graphene is produced mainly using mechanical exfoliation, chemical vapor deposition, epitaxial synthesis, or chemical exfoliation. Since graphene produced as such has a sheet resistance of thousands Ω/sq, various research and development has been conducted to reduce the sheet resistance to thereby apply graphene to industrial fields. In order to improve the sheet resistance, a method of stacking graphene in multiple layers has been proposed. However, such a method is problematic in that a larger number of processes are required thus leading to an increase in manufacturing cost, and the fraction of defective products is increased due to the repeated processes. For these reasons, the development of graphene aims to speed up a charge transfer or to increase the charge density in a single layer. As the method of increasing the charge density in a single layer, there is widely used a method wherein catalytic metal is removed and chemicals are doped onto a surface of the graphene by a wet process, during the graphene producing process.

The present invention may be used in the etching process wherein graphene synthesized on the catalytic metal is stacked on the flexible film F and the catalytic metal is removed from the flexible film F by the wet processing method.

In the conventional wet processing method, the etching process is performed by treating a flexible sample in a flat form. Therefore, the size of the flexible sample is partially enlarged, but an area thereof is restrictively increased. The reason is because a larger size of flexible sample makes it more difficult to handle the flexible sample and to uniformly react a solution with the surface of the sample. The present invention is capable of solving the problems occurring in the related art and effectively etching various flexible samples, such as the flexible film F.

As illustrated in FIGS. 2 and 3, the transfer unit 110 is intended to transfer the flexible film F to the etching unit 120, the washing unit 160, and the drying unit 170, and includes a carrier film 111, a coiler 112, and a plurality of transfer rollers 115, 116 and 117. The carrier film 111 is made of a flexible material that easily undergoes bending deformation. The carrier film 111 is coupled at an end thereof to an end of the flexible film F, and is transferred by the coiler 112 and the plurality of transfer rollers 115, 116, and 117 to pull the flexible film F. The carrier film 111 may be coupled with the flexible film F by taping or the like.

The coiler 112 has a coiler drum 113 around which the carrier film 111 is wound and stored, and a coiler drum driver 114 rotating the coiler drum 113. The coiler drum 113 may be rotated forwards or backwards by the coiler drum driver 114. By the rotation of the coiler drum 113, the carrier film 111 may be unwound from or re-wound around the coiler drum 113. The flexible film F as well as the carrier film 111 may be wound around the coiler drum 113 to be stored. Since the flexible film F is wound around the coiler drum 113 to be stored, it is possible to alleviate a problem where the flexible film F is crumpled or the surface of the flexible film is damaged by contact with an external object. The flexible film F that is on standby for etching or the flexible film F that has been subjected to etching may be wound around the coiler drum 113 to be temporarily stored.

The plurality of transfer rollers 115, 116, and 117 is disposed in the transfer path of the flexible film F between the coiler 112 and the etching unit 120. The plurality of transfer rollers 115, 116, and 117 guides the carrier film 111 and the flexible film F to stably transfer the carrier film 111 and the flexible film F while preventing them from being folded.

A worker cuts the carrier film 111 to a predetermined length, couples one end thereof to the drum-type jig 122 of the etching unit 120 by taping or the like, couples the other end of the carrier film 111 to the end of the flexible film F wound around the coiler drum 113, and then rotates the drum-type jig 122. Thereby, the flexible film F wound around the coiler drum 113 may be transferred to the drum-type jig 122 of the etching unit 120. Further, the carrier film 111 may be separated from the drum-type jig 122 and then the transferred flexible film F may be secured to the drum-type jig 122 by taping or the like. Furthermore, after the carrier film 111 is unwound from the coiler drum 113 and the end of the carrier film 111 is coupled to the end of the flexible film F wound around the drum-type jig 122, the coiler drum 113 may be rotated to transfer the flexible film F wound around the drum-type jig 122 towards the coiler drum 113.

Referring to FIGS. 2 to 4, the etching unit 120 includes a process tank 121 containing an etchant E therein, a drum-type jig 122 rotatably installed in the process tank 121, an etchant tank 124 installed adjacent to the process tank 121, and a plurality of injection nozzles 130 disposed towards the drum-type jig 122. The flexible film F on which a thin film is formed is fixedly wound around an outer circumference of the drum-type jig 122, so that the drum-type jig 122 is immersed in the etchant E along with the flexible film F. The drum-type jig 122 may be rotated forwards or backwards by the drum-type jig driver 123. An upper surface or a portion of the process tank 121 that is located higher than the drum-type jig 122 is opened to the outside so that the etchant E filled in the process tank can overflow towards the etchant tank 124.

Such an etching unit 120 supplies the etchant E to the process tank 121 such that the flexible film F is immersed in the etchant in the state where the flexible film F is fixedly wound around the drum-type jig 122, and rotates the drum-type jig 122, thus etching the surface of the flexible film F. The drum-type jig 122 immersed in the etchant E is rotated to create the uniform flow of the etchant E on the surface of the flexible film F and thereby allow the surface of the flexible film F to be uniformly etched, in addition to increasing etching efficiency.

Foreign matter removed from the flexible film F during the etching process floats in the etchant E and thereby is likely to concentrate on a surface of the etchant E. Therefore, when the etchant E is discharged from the process tank 121 after the etching process, the floating foreign matter may adhere to the flexible film F that has been etched and thus may cause the flexible film F to be contaminated.

In order to solve the problem, the etching apparatus 100 according to this embodiment overflows the upper etchant E where the foreign matter enters during the etching process from the process tank 121 to the etchant tank 124. Thus, it is possible to immediately remove the foreign matter produced during the etching process from the process tank 121 and thereby overcome a problem where the flexible film F that has been etched is contaminated by the foreign matter.

The process tank 121 and the etchant tank 124 are connected to each other to allow the etchant E to be circulated in a circulation pipe 125. The etchant pump 126 and the filter 127 are connected to the circulation pipe 125. The etchant pump 126 pumps the etchant E of the etchant tank 124 towards the process tank 121 or pumps the etchant E of the process tank 121 towards the etchant tank 124. During the etching process, the etchant E of the etchant tank 124 may be filtered by the filter 127 and then may be continuously supplied to the process tank 121.

As illustrated in FIGS. 3 and 4, the plurality of injection nozzles 130 is installed in the process tank 121 to be spaced apart from each other and sprays the etchant E towards the flexible film F wound around the drum-type jig 122. The plurality of injection nozzles 130 is connected with the process pump 132 via a guide pipe 131. The process pump 132 is installed in the process tank 121 to be immersed in the etchant E and pumps the etchant E contained in the process tank 121 through the guide pipe 131 to the plurality of injection nozzles 130. During the etching process, the plurality of injection nozzles 130 sprays the etchant E towards the flexible film F wound around the drum-type jig 122. These injection nozzles 130 act to create the uniform flow of the etchant E on the surface of the flexible film F, thus further enhancing the etching efficiency for the flexible film F. The plurality of injection nozzles 130 may be used for spraying washing liquid C (see FIG. 10) towards the flexible film F during a primary washing process after the etching process. Such a primary washing process will be described later. The installed number or arranged configuration of the injection nozzles 130 may be variously changed.

In addition to the plurality of injection nozzles 130, a subsidiary injection nozzle 133 is connected to the guide pipe 131 connected to the process pump 132. The subsidiary injection nozzle 133 is located at an upper position of the process tank 121 and is used to spray the washing liquid C during the washing process. A valve 134 is installed between the process pump 132 and the subsidiary injection nozzle 133 to control the flow of fluid through the guide pipe 131 to the subsidiary injection nozzle 133. By using the valve 134, the subsidiary injection nozzle 133 may be used only for spraying the washing liquid C.

A discharge pipe 140 is connected to the process tank 121 and the etchant tank 124 of the etching unit 120. The etchant E or the washing liquid C in the process tank 121 may be discharged through the discharge pipe 140 to a waste-liquid tank 145. Further, the etchant E in the etchant tank 124 may be discharged through the discharge pipe 140 to the waste-liquid tank 145.

Referring to FIGS. 2 and 3, the washing-liquid supply unit 150 includes a washing-liquid supply tank 151, a washing-liquid supply pipe 152, and a washing-liquid supply pump 153. Such a washing-liquid supply unit 150 supplies the washing liquid C to the process tank 121 during the primary washing process after the etching process. The washing liquid C stored in the washing-liquid supply tank 151 may be pumped to the washing-liquid supply pump 153 and then supplied through the washing-liquid supply pipe 152 to the process tank 121.

After the etching process, the etchant E is discharged from the process tank 121, and the washing-liquid supply unit 150 supplies the washing liquid C to the process tank 121 to perform the primary washing process for the flexible film F wound around the drum-type jig 122. The washing liquid C is supplied to the process tank 121 and is pumped by the process pump 132 to spray the washing liquid C onto the flexible film F wound around the drum-type jig 122 through the plurality of injection nozzles 130, thus primarily washing the flexible film F that has been etched. By rotating the drum-type jig 122 during the primary washing process, it is possible to enhance the efficiency of washing the flexible film F. After the primary washing process has been completed, the washing liquid C supplied to the process tank 121 is discharged through the discharge pipe 140 to the waste-liquid tank 145.

As illustrated in FIGS. 2 and 3, the washing unit 160 is disposed in the path where the flexible film F is transferred by the transfer unit 110, to perform a secondary washing process on the flexible film F that has been etched. The washing unit 160 includes a washing-liquid tank 161, a plurality of washing-liquid nozzles 162, and a washing-liquid pump 163. The plurality of washing-liquid nozzles 162 is connected to the washing-liquid pump 163 via the washing-liquid injection pipe 164. The washing-liquid pump 163 is installed in the washing-liquid tank 161 to pump the washing liquid C stored in the washing-liquid tank 161 towards the plurality of washing-liquid nozzles 162. When the flexible film F wound around the drum-type jig 122, which has been subjected to the etching process and the primary washing process, is transferred to the coiler 112 by the carrier film 111, the plurality of washing-liquid nozzles 162 sprays the washing liquid C onto the flexible film F to perform the secondary washing process on the flexible film F. The washing-liquid tank 161 is connected to the discharge pipe 140 to discharge the washing liquid C stored in the washing-liquid tank to the waste-liquid tank 145.

The drying unit 170 is disposed in the path where the flexible film F is transferred by the transfer unit 110, to perform a drying process on the flexible film F that has been subjected to the secondary washing process. The drying unit 170 includes an air feeder 171 and a plurality of air nozzles 172. The plurality of air nozzles 172 is connected with the air feeder 171 through an air feeding pipe 173. The air feeder 171 forces the air to be delivered through the air feeding pipe 173 to the plurality of air nozzles 172, and then the plurality of air nozzles 172 sprays the air onto the flexible film F to remove the etchant E and the washing liquid C from the flexible film F.

Hereinafter, the etching method using the etching apparatus 100 according to this embodiment will be described with reference to the accompanying drawings.

Figure 5:
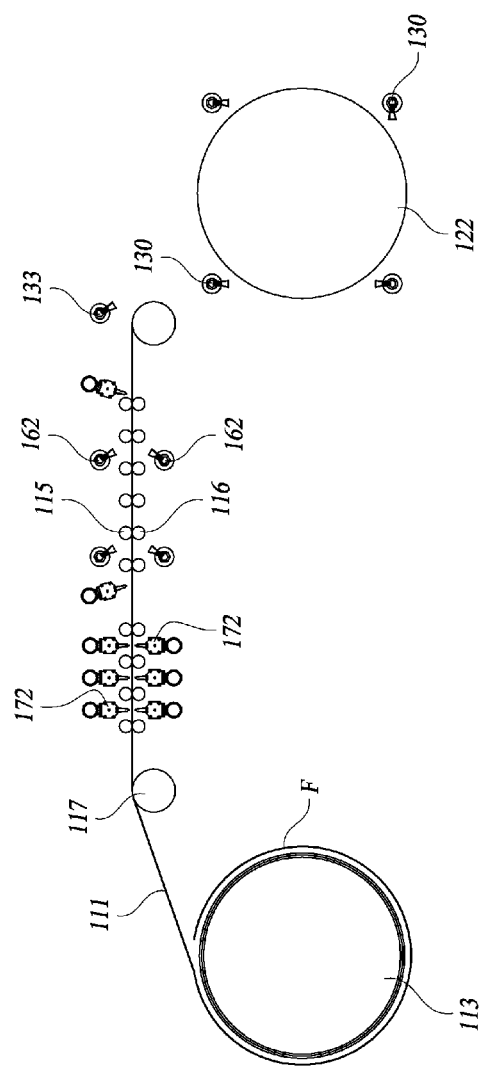
FIGS. 5 to 11 illustrate an etching method performed by the etching apparatus according to the embodiment of the present invention.

First, as illustrated in FIG. 5, the flexible film F that is wound around the coiler drum 113 of the coiler 112 and is on standby for etching is transferred to the drum-type jig 122 of the etching unit 120 using the carrier film 111.

Figure 6:
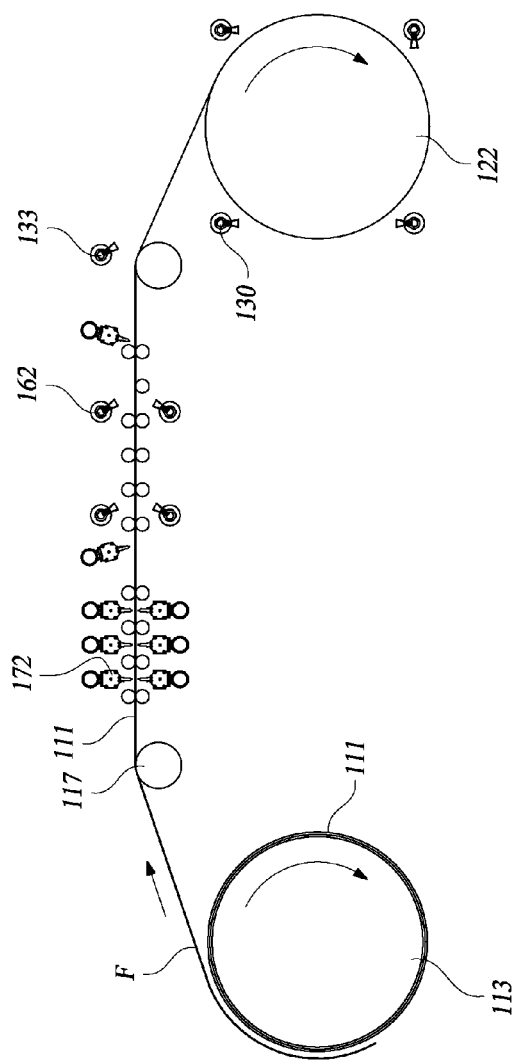

At this time, a worker connects one end of the carrier film 111 that is cut to a predetermined length to one end of the flexible film F by taping or the like, and pulls the other end of the carrier film 111 to couple it to the drum-type jig 122 by taping or the like. Further, the other end of the flexible film F is connected with another carrier film 111 wound around the coiler drum 113, by taping or the like. In this manner, a preparation work for transferring the flexible film F may be performed. Subsequently, as illustrated in FIG. 6, the drum-type jig 122 is rotated to wind the carrier film 111 around the drum-type jig 122. Thereby, the flexible film F wound around the coiler drum 113 may be pulled and transferred towards the drum-type jig 122. At this time, a reaction force acts on the flexible film F in an opposite direction by another carrier film 111 wound around the coiler drum 113, so that the flexible film may be transferred to the drum-type jig 122 while appropriately maintaining tension.

Figure 7:
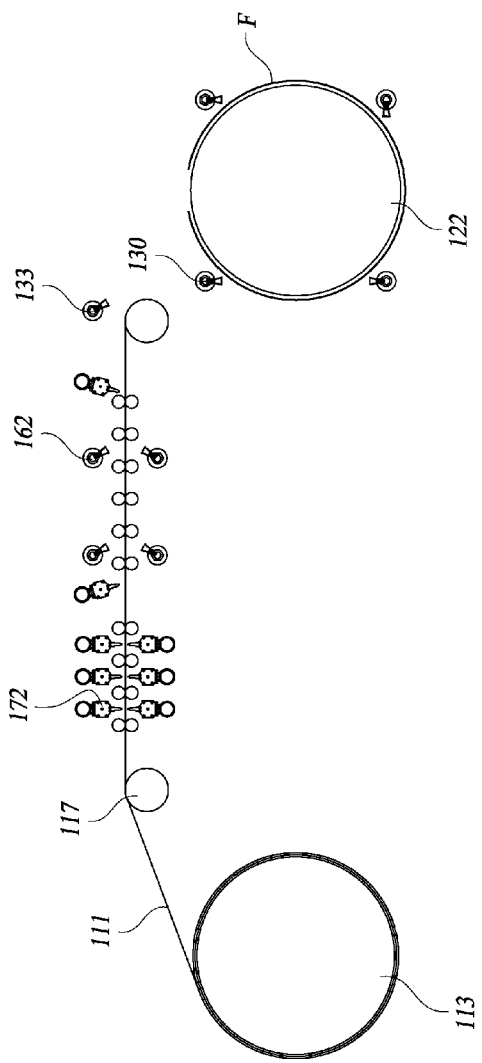

After the flexible film F is transferred to the drum-type jig 122, as illustrated in FIG. 7, a worker separates both ends of the flexible film F from the carrier film 111, and winds the flexible film F around the drum-type jig 122 to be secured thereto by taping or the like.

Figure 8:
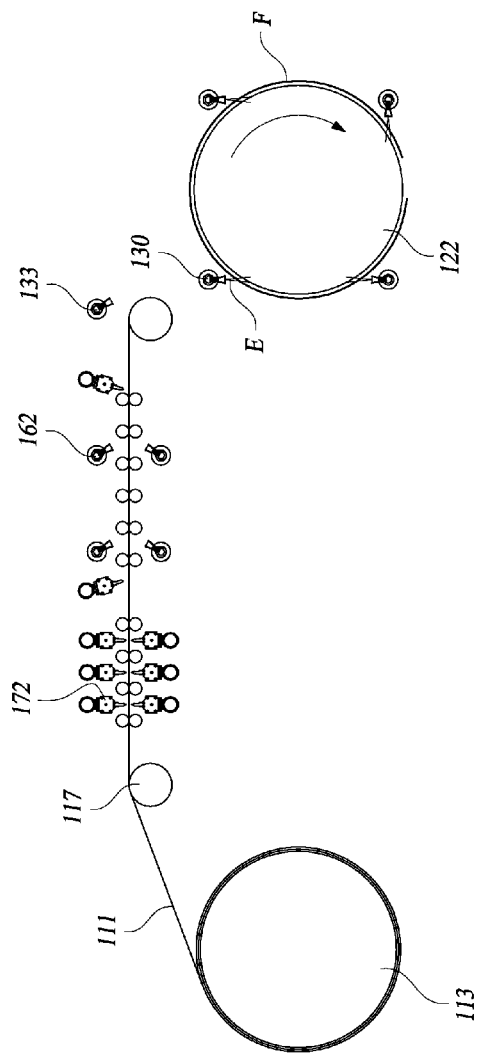

Next, as illustrated in FIG. 8, the etchant E is supplied to the process tank 121 to immerse the flexible film F in the etchant E. In this state, the etching process is performed on the flexible film F. At this time, the drum-type jig 122 is rotated and the etchant E is sprayed towards the flexible film F by the plurality of injection nozzles 130, thus generating the flow of the etchant E around the flexible film F. As such, if the flow of the etchant E is generated around the flexible film F during the etching process, the efficiency of etching the flexible film F may be enhanced.

During the etching process, the foreign matter removed from the flexible film F may float in the etchant E. By overflowing the upper etchant E where the foreign matter floats from the process tank 121 to the etchant tank 124, it is possible to immediately remove the foreign matter produced during the etching process from the process tank 121. Furthermore, after the etchant E of the etchant tank 124 is pumped by the etchant pump 126 and is filtered by the filter 127 during the etching process, the etchant is continuously supplied to the process tank 121, thus preventing the etching efficiency from being deteriorated.

If the etching process has been completed, the etchant E is discharged from the process tank 121, and the washing liquid C is supplied through the washing-liquid supply unit 150 to the process tank 121, so that the primary washing process is performed on the flexible film F. At this time, while the drum-type jig 122 is rotated, the washing liquid C supplied to the process tank 121 is sprayed onto the flexible film F wound around the drum-type jig 122 using the process pump 132 and the plurality of injection nozzles 130. Thereby, it is possible to enhance the efficiency of washing the flexible film F.

Figure 9:
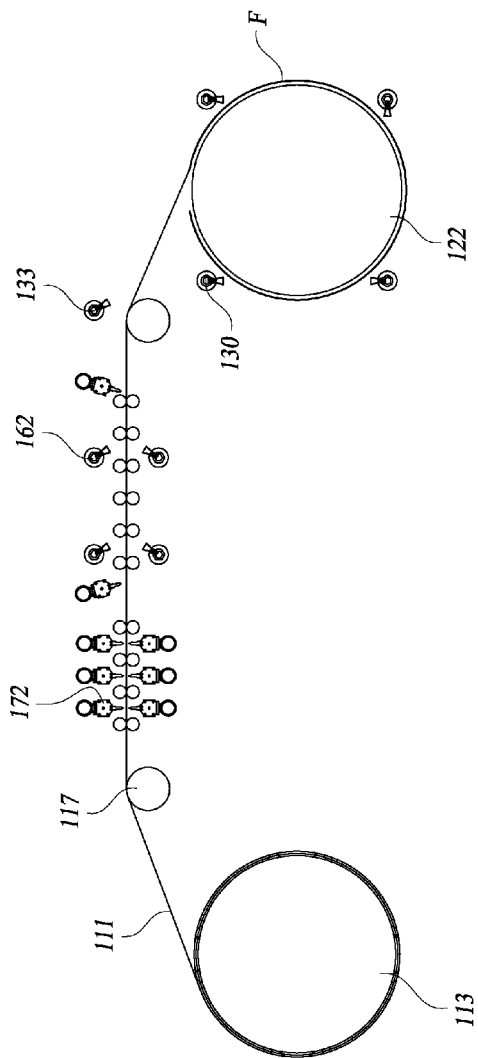
Figure 10:
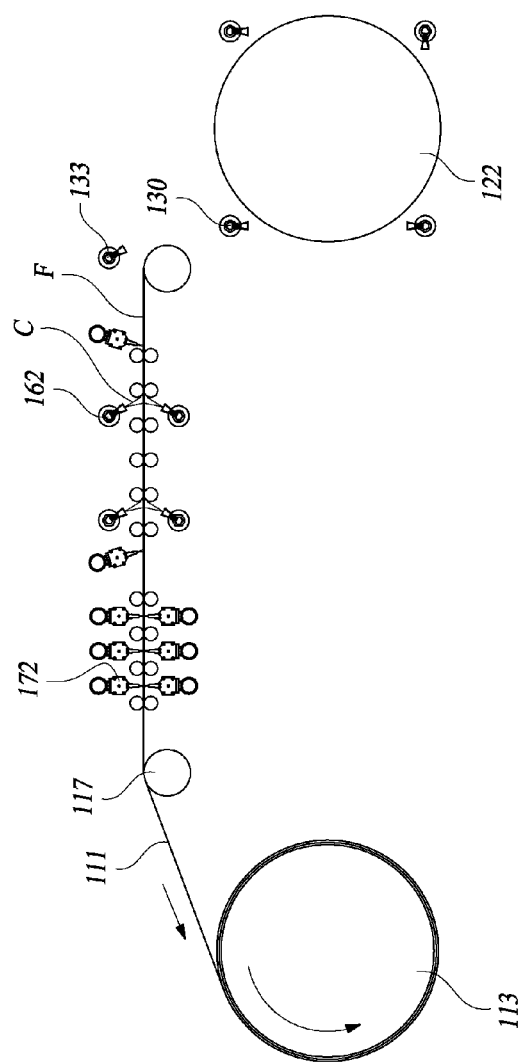

If the primary washing process for the flexible film F has been completed, as illustrated in FIG. 9, the washing liquid C is discharged from the process tank 121 and one end of the flexible film F wound around the drum-type jig 122 is connected to the end of the carrier film 111 by taping or the like. Further, as illustrated in FIG. 10, the coiler drum 113 is rotated to transfer the flexible film F from the drum-type jig 122 to the coiler drum 113 by the carrier film 111.

While the flexible film F is transferred to the coiler drum 113 as such, the washing unit 160 sprays the washing liquid C onto the flexible film F to perform the secondary washing process on the flexible film F. Further, when the flexible film F that has undergone the secondary washing process passes through the drying unit 170, the drying unit 170 sprays the air onto the flexible film F to perform the drying process on the flexible film F.

Figure 11:
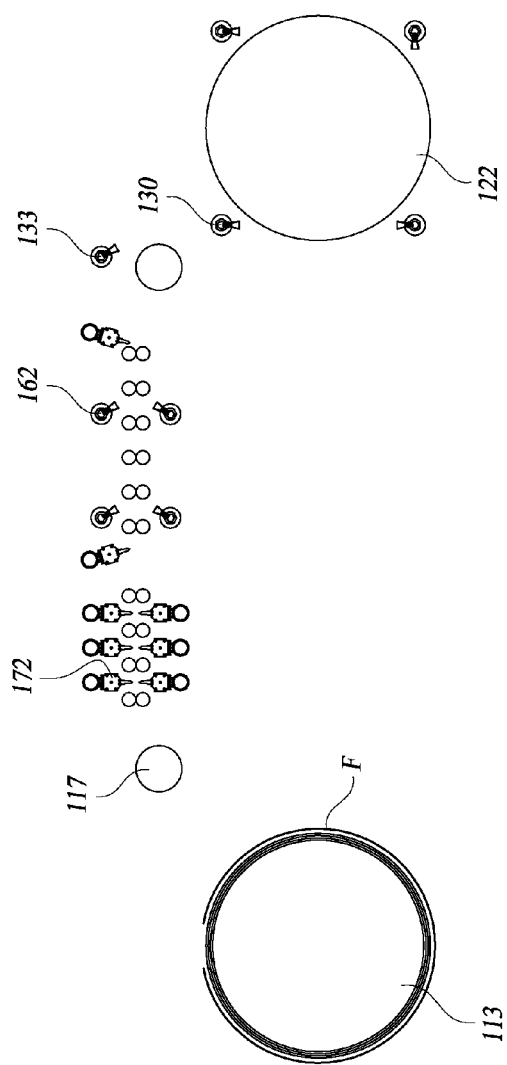

After the flexible film F sequentially passes through the washing unit 160 and the drying unit 170, the flexible film may be wound around the coiler drum 113 to be recovered, as illustrated in FIG. 11. A worker may temporarily store the flexible film F etched in the same manner as the above-described method, with the flexible film being wound around the coiler drum 113, or may separate the flexible film F from the coiler drum 113 to convey the flexible film to another position.

As described above, the etching apparatus 100 according to this embodiment has a compact structure to efficiently perform the etching process on the large area flexible film F. Further, the uniform flow of the etchant E is generated on the surface of the flexible film F, thus allowing the surface of the flexible film F to be etched with uniform quality. Furthermore, while the flexible film F is transferred, its tension is maintained to prevent the flexible film from being crumpled, and the flexible film is not in contact with the external component to prevent the thin film formed on the flexible film F from being damaged.

Figure 12:
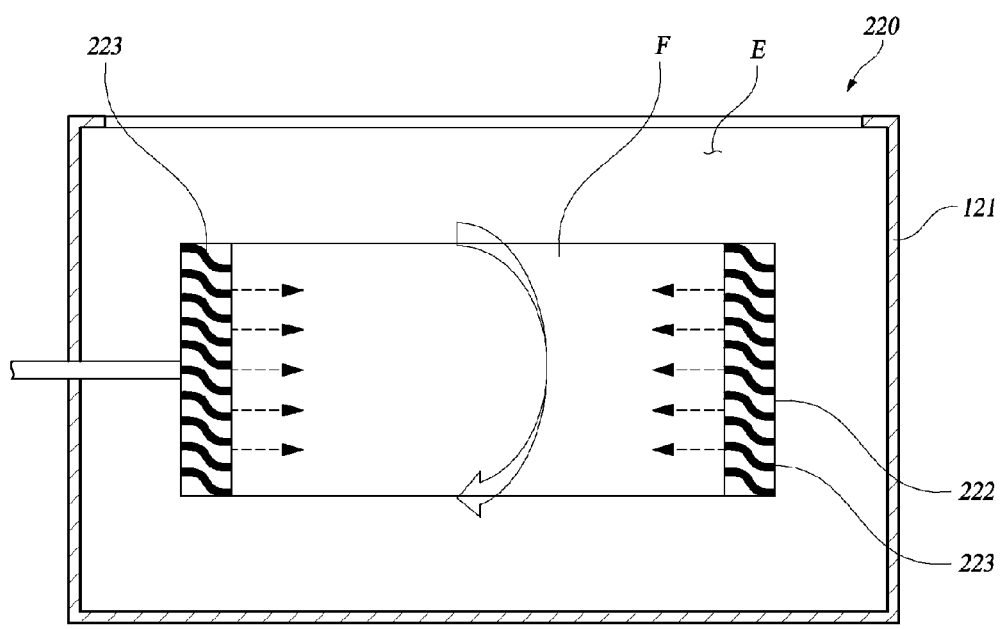
FIG. 12 is a front sectional view illustrating a variant of the etching unit provided in the etching apparatus according to the present invention.
Figure 13:
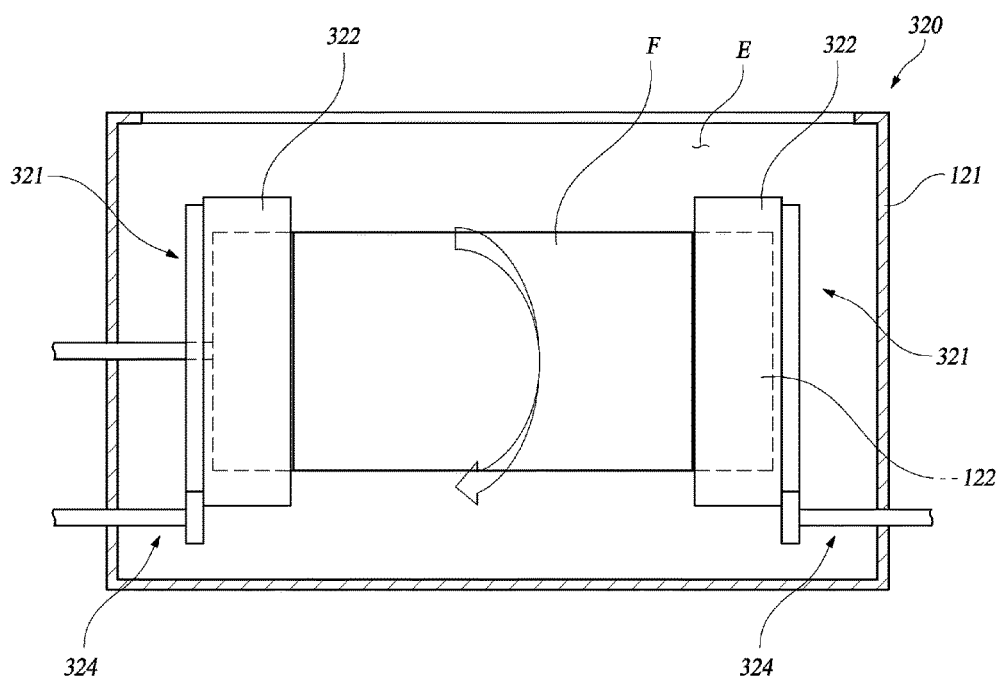
FIG. 13 is a front sectional view illustrating another variant of the etching unit provided in the etching apparatus according to the present invention.
Figure 14:
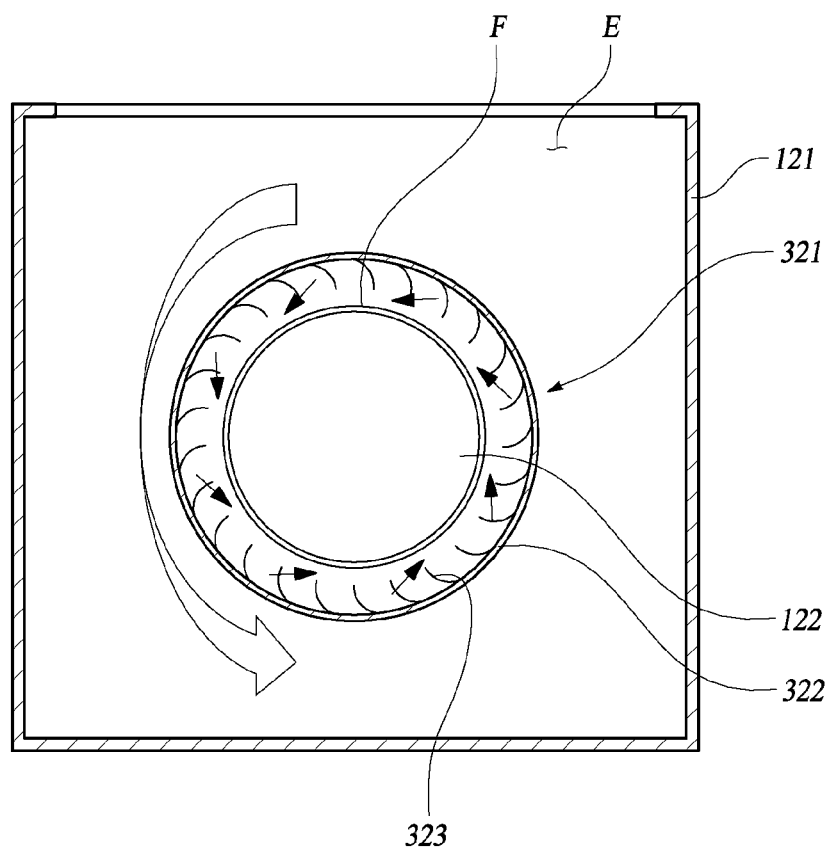
FIG. 14 is a side sectional view illustrating the etching unit of FIG. 13.

Meanwhile, FIGS. 12 to 14 illustrate various variants of the etching unit provided in the etching apparatus according to the present invention.

First, an etching unit 220 of FIG. 12 includes a process tank 121, and a drum-type jig 222 rotatably installed in the process tank 121. A plurality of flow guide grooves 223 is formed along an outer circumference of the drum-type jig 222. The plurality of flow guide grooves 223 generates the flow of the etchant E towards the flexible film F wound around the drum-type jig 222 when the jig is rotated. Such an etching unit 220 is configured such that the plurality of flow guide grooves 223 generates the uniform flow of the etchant E on a surface of the flexible film F wound around the drum-type jig 222 when the jig is rotated, thus allowing the surface of the flexible film F to be uniformly etched and enhancing the etching efficiency. Therefore, it is possible to achieve the same effect as the above-described etching unit 120 without installing the injection nozzles 130.

An etching unit 320 of FIGS. 13 and 14 includes a process tank 121, a drum-type jig 122 rotatably installed in the process tank 121, and a flow generator 321 rotatably installed in the process tank 121. The flow generator 321 has a rotary body 322, a plurality of blades 323 provided in the rotary body 322, and a rotary-body driver 324 rotating the rotary body 322. The rotary body 322 is rotatably installed in the process tank 121 to surround the drum-type jig 122. When the rotary body 322 is rotated by the rotary-body driver 324, the plurality of blades 323 provided in the rotary body 322 generates the flow of the etchant E in the rotary body 322. Therefore, the uniform flow of the etchant E is generated on the surface of the flexible film F wound around the drum-type jig 122, so that it is possible to uniformly etch the surface of the flexible film F and to enhance the etching efficiency.

Although it is shown in the drawing that a pair of flow generators 321 is placed on both ends of the drum-type jig 122 such that one flow generator is on each end of the drum-type jig, the installed number or arranged configuration of the flow generators may be variously changed. Further, although it is shown in the drawing that the flow generator 321 surrounds the drum-type jig 122, various structures are possible as the flow generator, as long as the structure rotates the rotary body and generates the flow of fluid supplied to the process tank 121.

Although the preferred embodiments of the present invention have been explained, the scope of the present invention is not limited to the foregoing description taken with reference to the accompanying drawings.

The transfer unit 110 may be provided in various different forms, for example, the coiler 112 may be omitted.

The etching unit 120 basically has the process tank 121 and the drum-type jig 122 installed therein, and several components may be additionally provided on the basic structure to make various different structures. As another example, the etching unit may be changed into a structure having no washing function.

Further, the washing unit 160 may be provided in various different forms capable of performing the washing process as well as the illustrated structure, and the drying unit 170 may be provided in various different forms capable of performing the drying process as well as the illustrated structure.

Furthermore, the etching apparatus according to the present invention may be provided in various different forms, including an etching unit having an etching function as a basic element and other components as additional elements.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An etching apparatus, comprising:
   a process tank containing an etchant therein;
   a drum-type jig rotatably provided in the process tank to be immersed into the etchant in a state where a flexible film on which a thin film is formed is wound fully around the drum-type jig; and
   a drum-type jig driver configured to rotate the drum-type jig,
   wherein the drum-type jig comprises a plurality of flow guide grooves along an outer circumference thereof to generate a flow of the etchant towards the flexible film wound therearound when the jig is rotated.

2. The etching apparatus as set forth in claim 1, further comprising:
an injection nozzle provided in the process tank to spray the etchant towards the flexible film wound fully around the drum-type jig; and
a process pump configured to pump the etchant to the injection nozzle.

3. The etching apparatus as set forth in claim 2, further comprising:
a washing-liquid supply unit supplying washing liquid to the process tank to which the etchant is discharged, to perform a washing process on the flexible film wound fully around the drum-type jig,
wherein the process pump is provided in the process tank to pump the etchant or the washing liquid contained in the process tank to the injection nozzle.

4. The etching apparatus as set forth in claim 1, further comprising:
a rotary body rotatably provided in the process tank;
a plurality of blades provided on the rotary body; and a flow generator having a rotary-body driver to rotate the rotary body and generating the flow of the etchant towards the flexible film wound fully around the drum-type jig.

5. The etching apparatus as set forth in claim 1, further comprising:
an etchant tank provided adjacent to the process tank to store the etchant therein,
wherein the etchant in which foreign matter generated during the etching process floats overflows from the process tank to the etchant tank.

6. The etching apparatus as set forth in claim 5, further comprising:
a circulation pipe connecting the process tank with the etchant tank to allow the etchant to flow therein; and
an etchant pump pumping the etchant stored in the etchant tank through the circulation pipe to the process tank.

7. The etching apparatus as set forth in claim 1, further comprising:
a carrier film coupled with the flexible film; and
a coiler drum coupled with the carrier film and rotated forwards or backwards to wind or unwind the carrier film.

8. The etching apparatus as set forth in claim 7, further comprising:
a drying unit provided on a transfer path of the flexile film transferred by the carrier film to spray air onto the flexible film transferred by the carrier film and then dry the carrier film.

9. The etching apparatus as set forth in claim 7, further comprising:
a washing unit provided on a transfer path of the flexile film transferred by the carrier film to spray washing liquid onto the flexible film transferred by the carrier film and then wash the carrier film.

10. An etching apparatus, comprising:
a process tank containing an etchant therein;
a drum-type jig rotatably provided in the process tank to be immersed into the etchant in a state where a flexible film on which a thin film is formed is wound fully around the drum-type jig; and
a drum-type jig driver configured to rotate the drum-type jig.

11. The etching apparatus as set forth in claim 10, further comprising:
an injection nozzle provided in the process tank to spray the etchant towards the flexible film wound fully around the drum-type jig; and
a process pump configured to pump the etchant to the injection nozzle.

12. The etching apparatus as set forth in claim 11, further comprising:
a washing-liquid supply unit supplying washing liquid to the process tank to which the etchant is discharged, to perform a washing process on the flexible film wound fully around the drum-type jig,
wherein the process pump is provided in the process tank to pump the etchant or the washing liquid contained in the process tank to the injection nozzle.

13. The etching apparatus as set forth in claim 10, further comprising:
a rotary body rotatably provided in the process tank;
a plurality of blades provided on the rotary body; and a flow generator having a rotary-body driver to rotate the rotary body and generating the flow of the etchant towards the flexible film wound fully around the drum-type jig.

14. The etching apparatus as set forth in claim 10, further comprising:
an etchant tank provided adjacent to the process tank to store the etchant therein,
wherein the etchant in which foreign matter generated during the etching process floats overflows from the process tank to the etchant tank.

15. The etching apparatus as set forth in claim 14, further comprising:
a circulation pipe connecting the process tank with the etchant tank to allow the etchant to flow therein; and
an etchant pump pumping the etchant stored in the etchant tank through the circulation pipe to the process tank.

16. The etching apparatus as set forth in claim 10, further comprising:
a carrier film coupled with the flexible film; and
a coiler drum coupled with the carrier film and rotated forwards or backwards to wind or unwind the carrier film.

17. The etching apparatus as set forth in claim 16, further comprising:
a drying unit provided on a transfer path of the flexile film transferred by the carrier film to spray air onto the flexible film transferred by the carrier film and then dry the carrier film.

18. The etching apparatus as set forth in claim 16, further comprising:
a washing unit provided on a transfer path of the flexile film transferred by the carrier film to spray washing liquid onto the flexible film transferred by the carrier film and then wash the carrier film.

19. An etching apparatus, comprising:
a process tank containing an etchant therein;
a drum-type jig rotatably provided in the process tank to be immersed into the etchant in a state where a flexible film on which a thin film is formed is wound fully around the drum-type jig;
a drum-type jig driver configured to rotate the drum-type jig,
an etchant tank provided adjacent to the process tank to store the etchant therein,
wherein the etchant in which foreign matter generated during the etching process floats overflows from the process tank to the etchant tank, a circulation pipe connecting the process tank with the etchant tank to allow the etchant to flow therein;

an etchant pump pumping the etchant stored in the etchant tank through the circulation pipe to the process tank;

a carrier film coupled with the flexible film;

a coiler drum coupled with the carrier film and rotated forwards or backwards to wind or unwind the carrier film;

a washing-liquid supply unit supplying washing liquid to the process tank to which the etchant is discharged, to perform a washing process on the flexible film wound fully around the drum-type jig, wherein the process pump is provided in the process tank to pump the etchant or the washing liquid contained in the process tank;

a washing unit provided on a transfer path of the flexile film transferred by the carrier film to spray washing liquid onto the flexible film transferred by the carrier film and then wash the carrier film; and a drying unit provided on a transfer path of the flexile film transferred by the carrier film to spray air onto the flexible film transferred by the carrier film and then dry the carrier film.

* * * * *